(12) United States Patent
Lee et al.

(10) Patent No.: US 10,917,985 B1
(45) Date of Patent: Feb. 9, 2021

(54) FLEXIBLE DISPLAY DEVICE

(71) Applicant: LG Display Co., Ltd., Seoul (KR)

(72) Inventors: Hoontaek Lee, Gyeonggi-do (KR); JaeHo Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/023,139

(22) Filed: Sep. 16, 2020

(30) Foreign Application Priority Data

Apr. 21, 2020 (KR) .......................... 10-2020-0048182

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
None
See application file for complete search history.

(56) References Cited

U.S. PATENT DOCUMENTS

| | | | |
|---|---|---|---|
| 7,868,545 B2 | 1/2011 | Hioki et al. | |
| 10,499,520 B2* | 12/2019 | Lim | H05K 5/0247 |
| 10,645,820 B2* | 5/2020 | Ma | H05K 5/0017 |
| 2011/0007042 A1* | 1/2011 | Miyaguchi | G02F 1/133305 |
| | | | 345/204 |
| 2015/0261033 A1* | 9/2015 | Shin | H05K 5/0086 |
| | | | 349/58 |
| 2016/0233573 A1* | 8/2016 | Son | H01Q 9/04 |
| 2016/0353593 A1* | 12/2016 | Park | G06F 1/1601 |
| 2017/0159687 A1* | 6/2017 | Jung | H05K 5/03 |
| 2018/0160554 A1* | 6/2018 | Kang | H05K 5/0247 |

FOREIGN PATENT DOCUMENTS

| | | |
|---|---|---|
| JP | 2008-26710 A | 2/2008 |
| KR | 10-2014-0095316 A | 8/2014 |
| KR | 10-2014-0127470 A | 11/2014 |
| KR | 10-2015-0058990 A | 5/2015 |
| KR | 10-2015-0061418 A | 6/2015 |
| KR | 10-2015-0133886 A | 12/2015 |

* cited by examiner

*Primary Examiner* — Xanthia C Cunningham
(74) *Attorney, Agent, or Firm* — Seed IP Law Group LLP

(57) ABSTRACT

A flexible display device includes a back cover supporting and engaged with the rear surface of a display panel, a curvature changing member provided on the rear surface of the back cover and configured to change a curvature of the back cover, and a rear cover bent along with the back cover and supporting the rear surface of the back cover.

25 Claims, 20 Drawing Sheets

FLEXIBLE DISPLAY DEVICE

CROSS REFERENCE TO RELATED APPLICATION

This application claims priority from Korean Patent Application No. 10-2020-0048182, filed on Apr. 21, 2020, which is hereby incorporated by reference for all purposes as if fully set forth herein.

BACKGROUND

Technical Field

Embodiments of the present disclosure relate to a flexible display device.

Description of Related Art

In general, liquid crystal display (LCD) devices, plasma display devices, field emission display devices, and light emitting display devices are under active research as flat display devices. Among them, the LCD devices and the light emitting display devices have attracted attention in view of their benefits of mass production, ease of driving means, and high image quality.

Along with studies on technical shortcomings of these flat panel display devices, the necessity of research and development in the structural aspects of flexible display products such as curved and rolling types more appealing to users has been highlighted.

However, such a flexible display device has a curvature changing mechanism engaged with the rear surface of a display panel and then engaged with a rear cover. Due to the rigidity of the rear cover engaged with the rears of the display panel and a back cover, it is difficult to achieve a constant curvature from the center of the display panel to both ends of the display panel and maintain the support force and durability of the rear cover.

Moreover, since the flexible display device has a structure making it difficult to rapidly change the curvature of the display panel to a variety of user-intended curvatures and continuously maintain the changed curvature from the display panel to the rear cover.

Therefore, there is a need for research to solve the above-described problems.

BRIEF SUMMARY

Embodiments of the present disclosure provide a flexible display device allowing a user to freely change the curvature of a display panel to the curvature of a flat display or the curvature of a curved display.

Embodiments of the present disclosure also provide a flexible display device in which all components including a display panel, a back cover, and a rear cover are configured to facilitate achievement of a user-intended curvature from the center to both ends of the display panel irrespective of the size of the flexible display device, thereby satisfying various user demands.

The objectives of the embodiments of the present disclosure are not limited to what has been described above, and other unmentioned objectives will be clearly understood to those skilled in the art from the following description.

According to an aspect, embodiments of the present disclosure provide a flexible display device including a back cover supporting and engaged with the rear surface of a display panel, a curvature changing member provided on the rear surface of the back cover and changing a curvature, and a rear cover bent along with the back cover and supporting the rear surface of the back cover.

According to embodiments of the present disclosure, a flexible display device may be provided, which allows a user to freely change the curvature of a display panel to the curvature of a flat display or the curvature of a curved display.

According to embodiments of the present disclosure, a flexible display device may also be provided, in which all components including a display panel, a back cover, and a rear cover are configured to facilitate achievement of a user-intended curvature from the center to both ends of the display panel irrespective of the size of the flexible display device, thereby satisfying various user demands.

DETAILED DESCRIPTION

Figure 1:
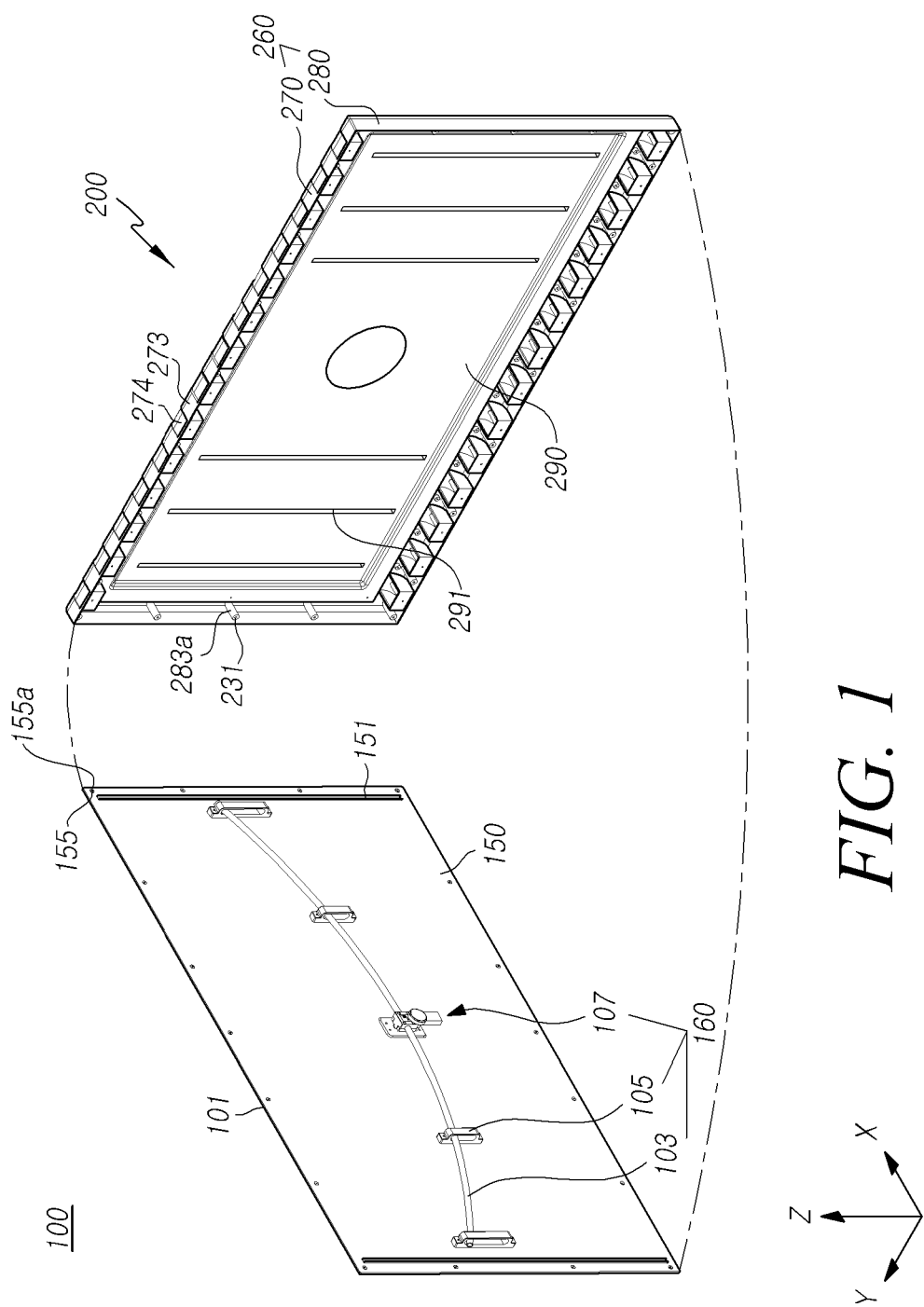
FIG. 1 is a perspective view illustrating a flexible display device according to embodiments of the present disclosure.
Figure 2:
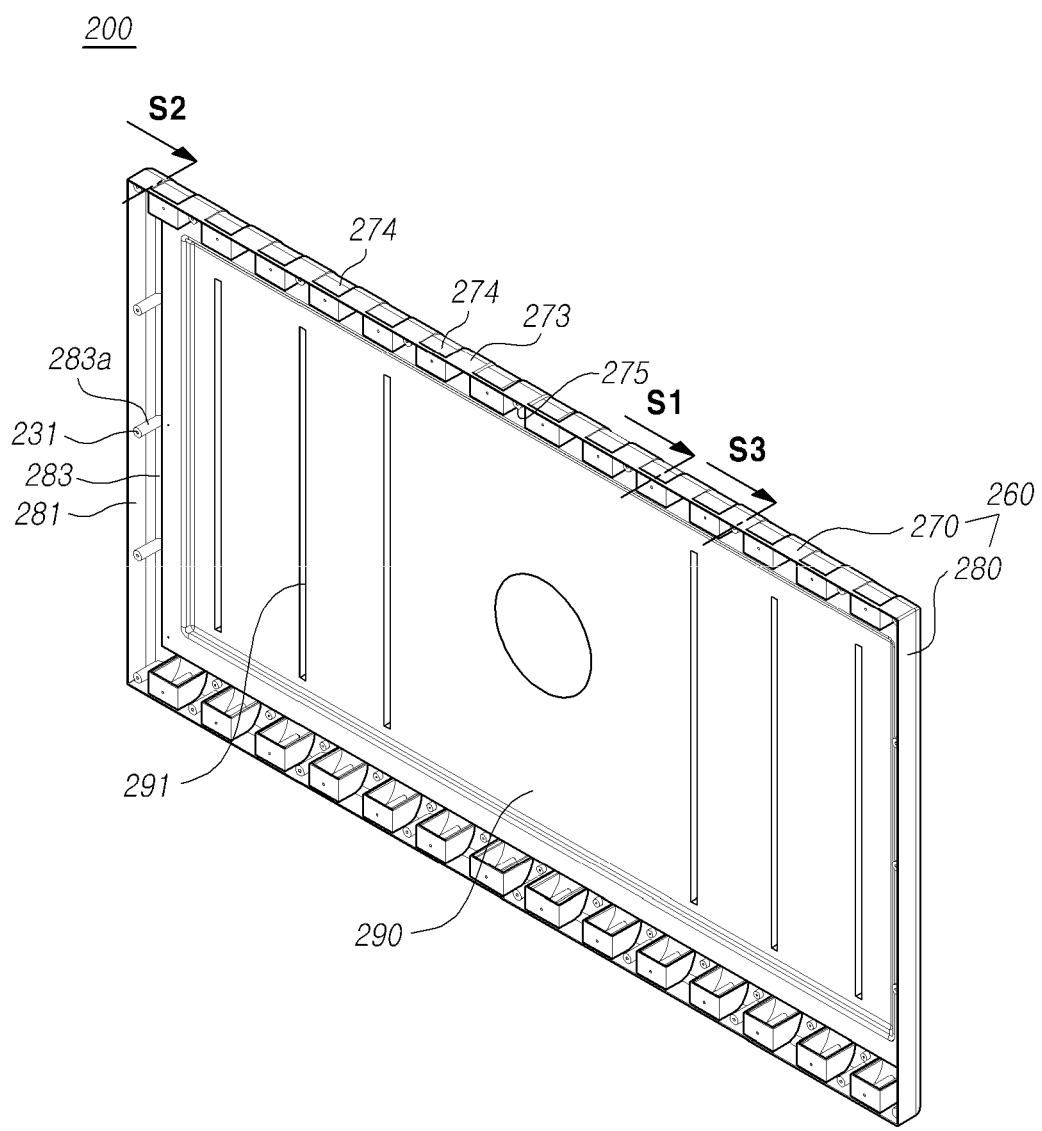
FIGS. 2 to 5 are perspective views illustrating parts of the flexible display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to", "contacts or overlaps", etc., a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc., each other via a fourth element. Here, the second element may be included in at least one of two or more elements that "are connected or coupled to", "contact or overlap", etc., each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Figure 6:
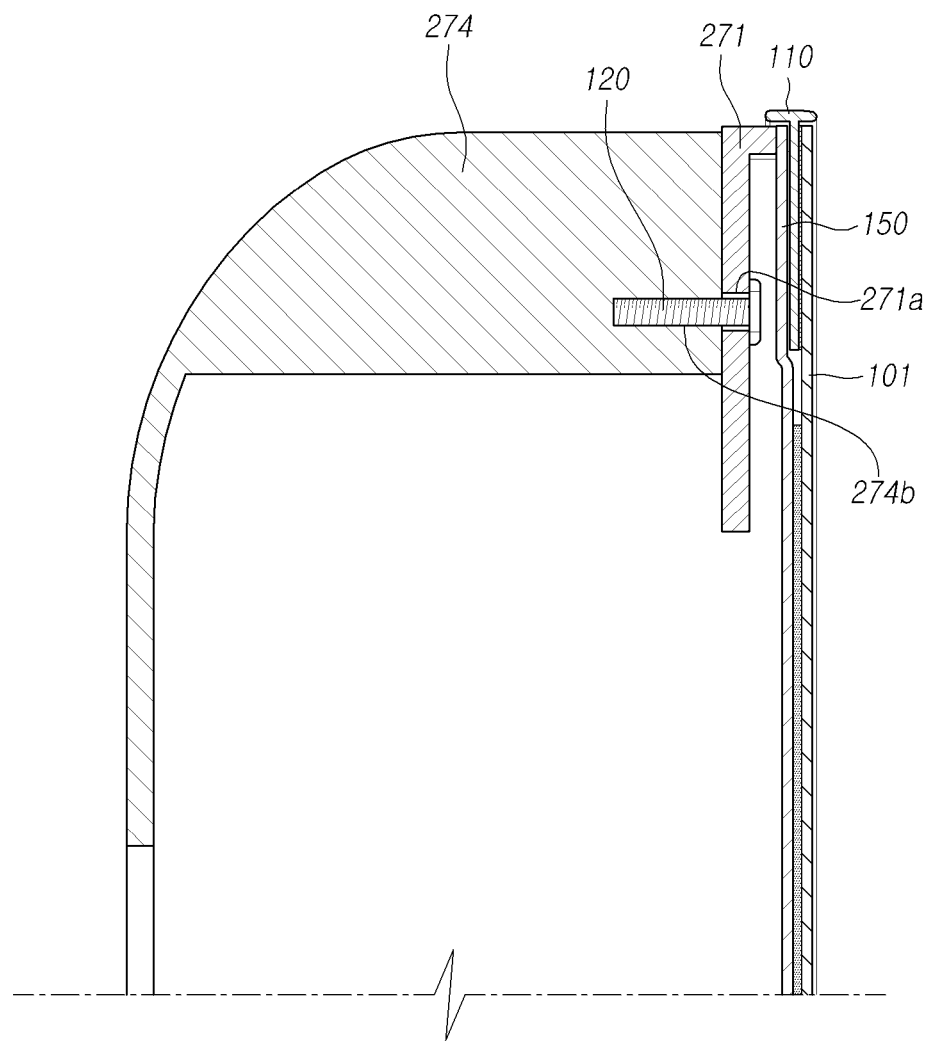
FIG. 6 is a sectional view illustrating a part 51 illustrated in FIG. 2.
Figure 7:
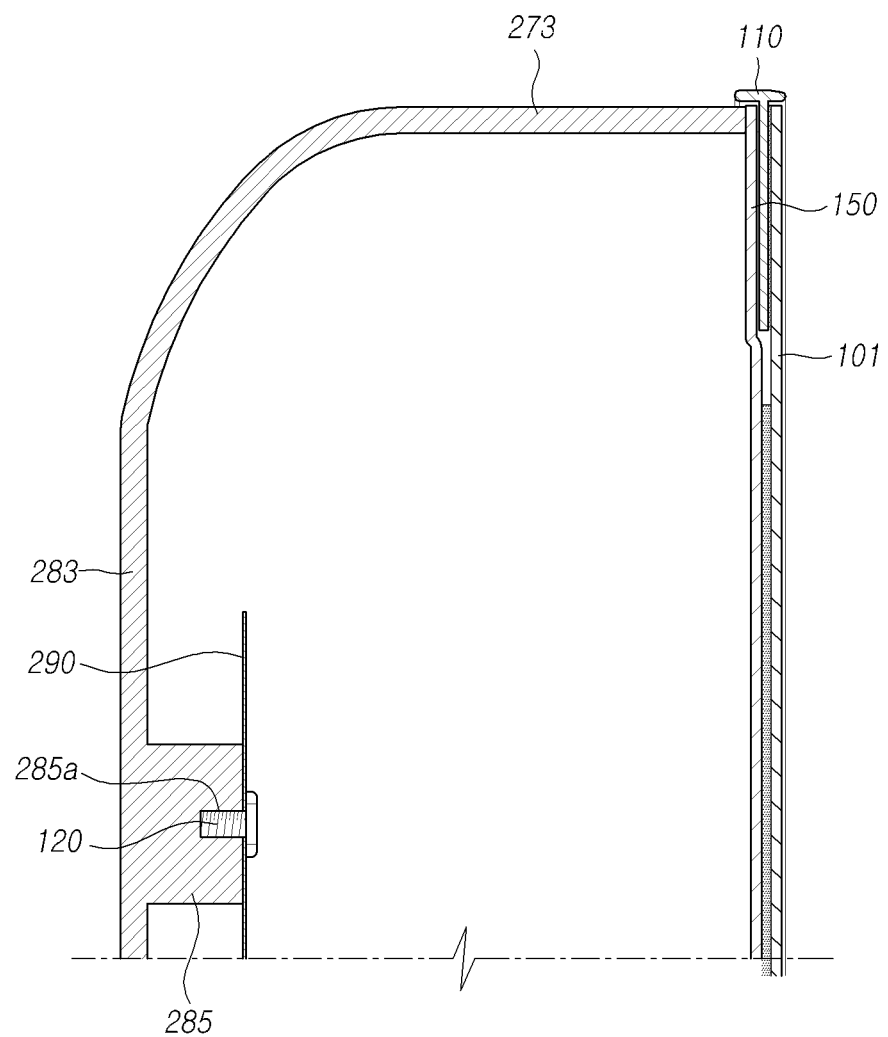
FIG. 7 is a sectional view illustrating a part S2 illustrated in FIG. 2.
Figure 8:
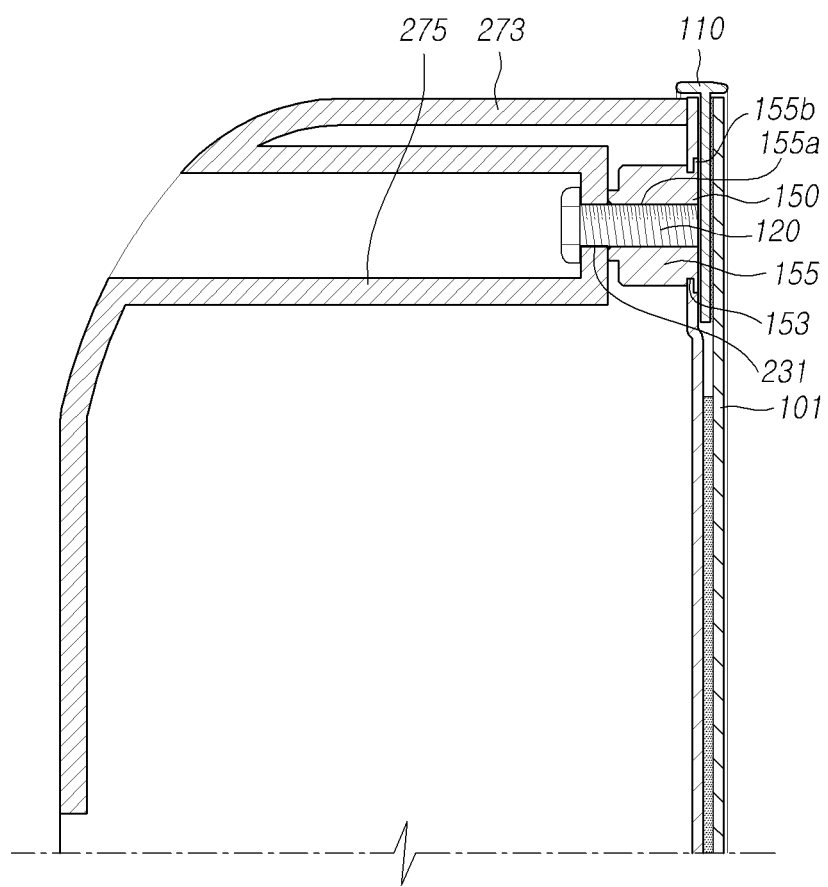
FIG. 8 is a sectional view illustrating a part S3 illustrated in FIG. 2.
Figure 9:
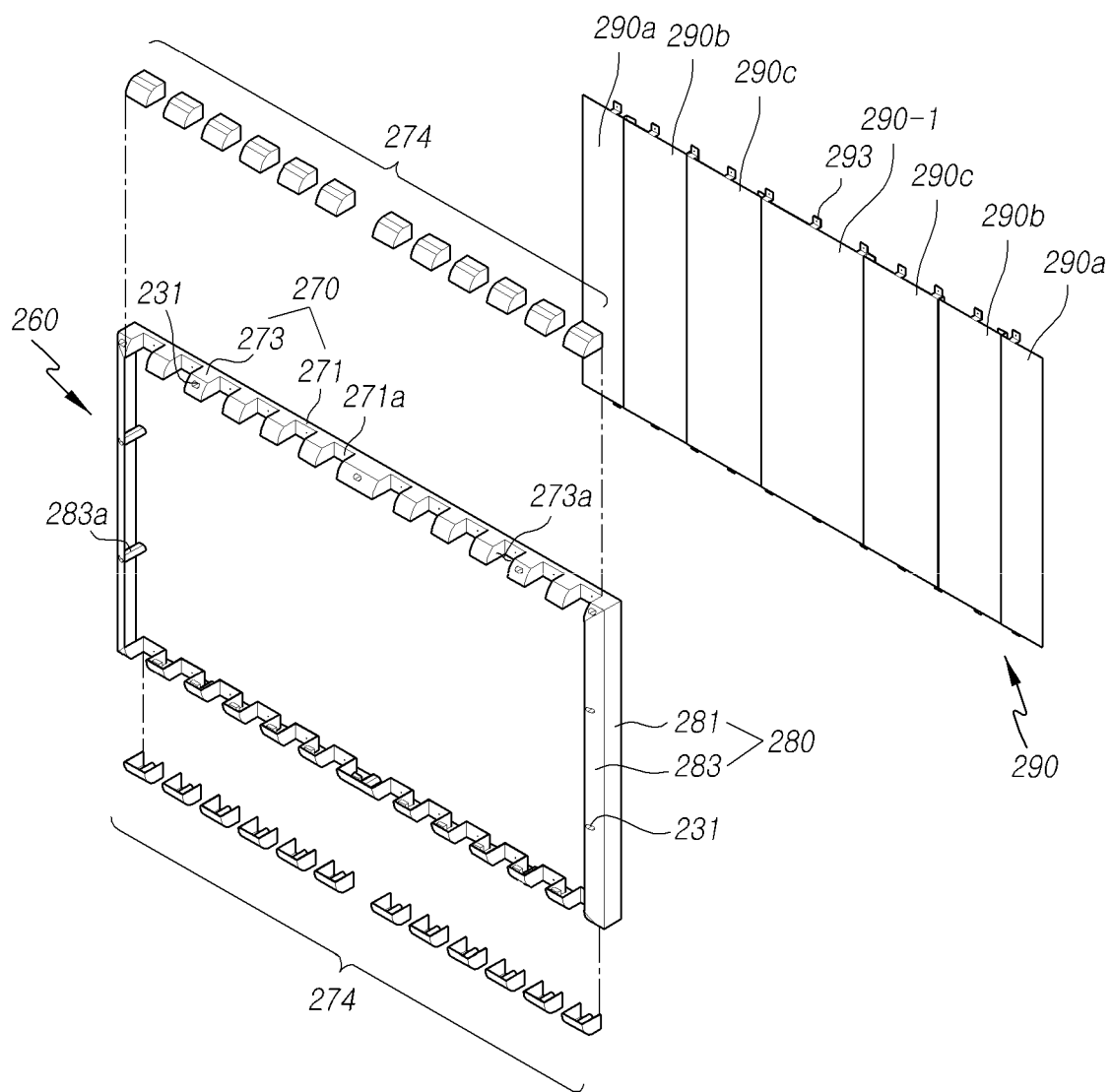
FIGS. 9 and 10 are perspective views illustrating parts of the flexible display device according to embodiments of the present disclosure.
Figure 10:
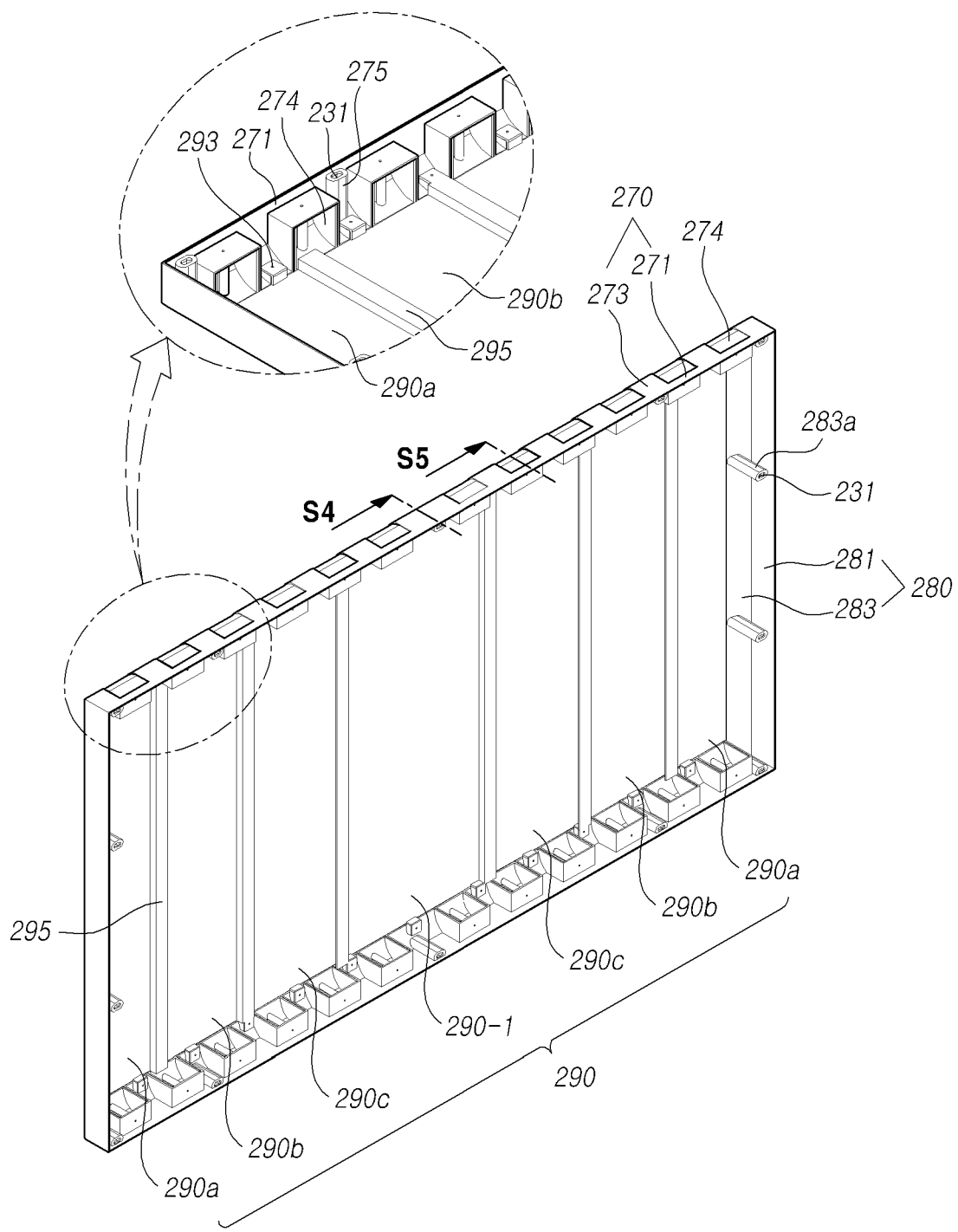
Figure 11:
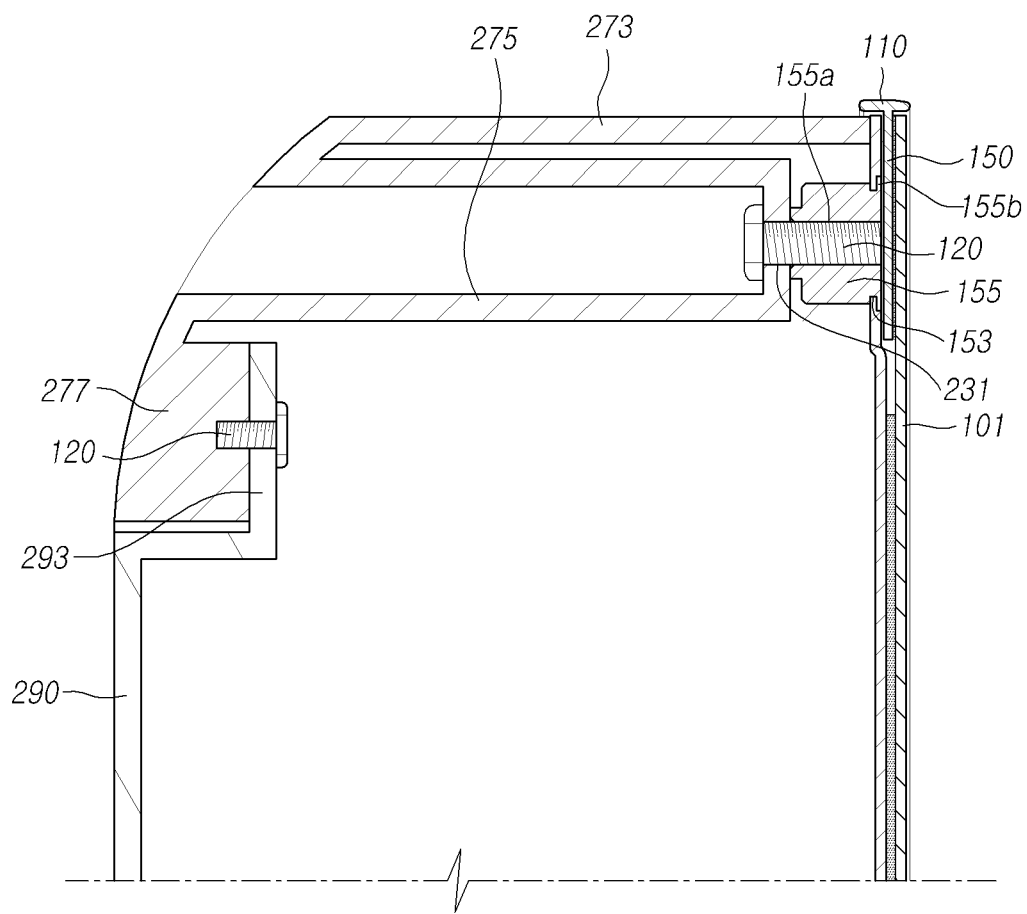
FIG. 11 is a sectional view illustrating a part S4 illustrated in FIG. 10.
Figure 12:
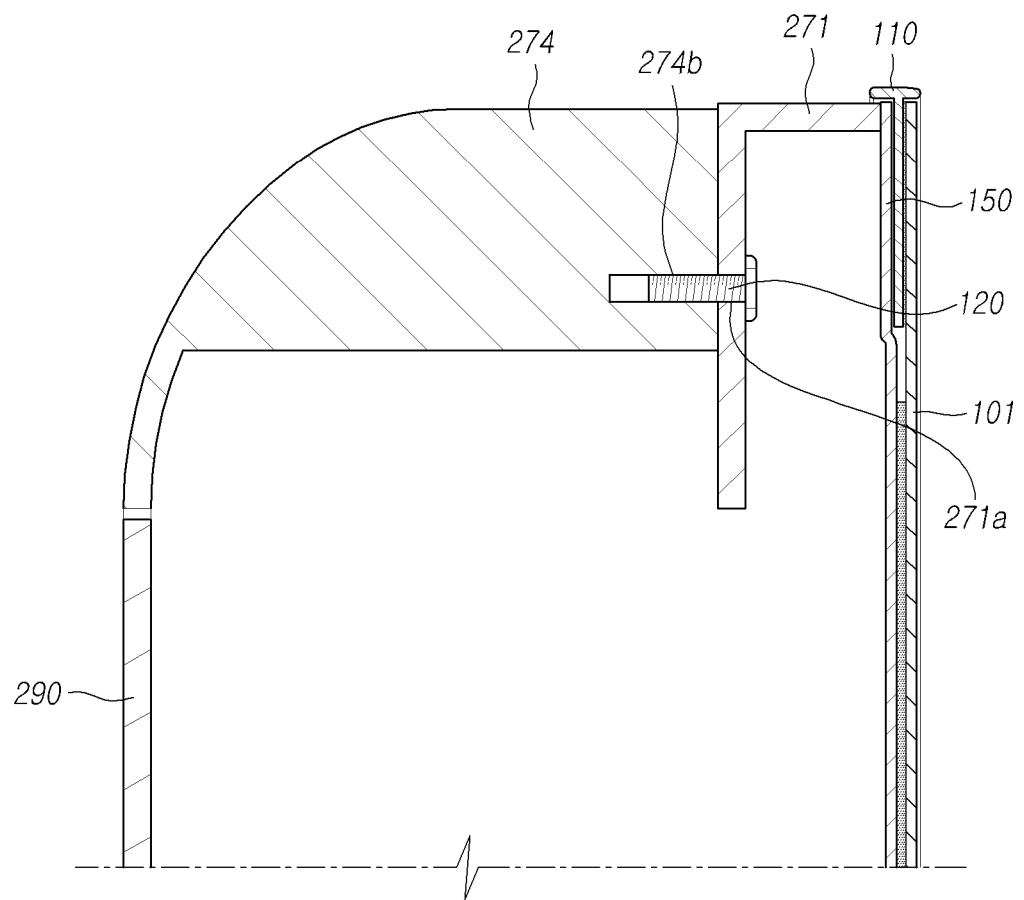
FIG. 12 is a sectional view illustrating a part S5 illustrated in FIG. 10.
Figure 13:
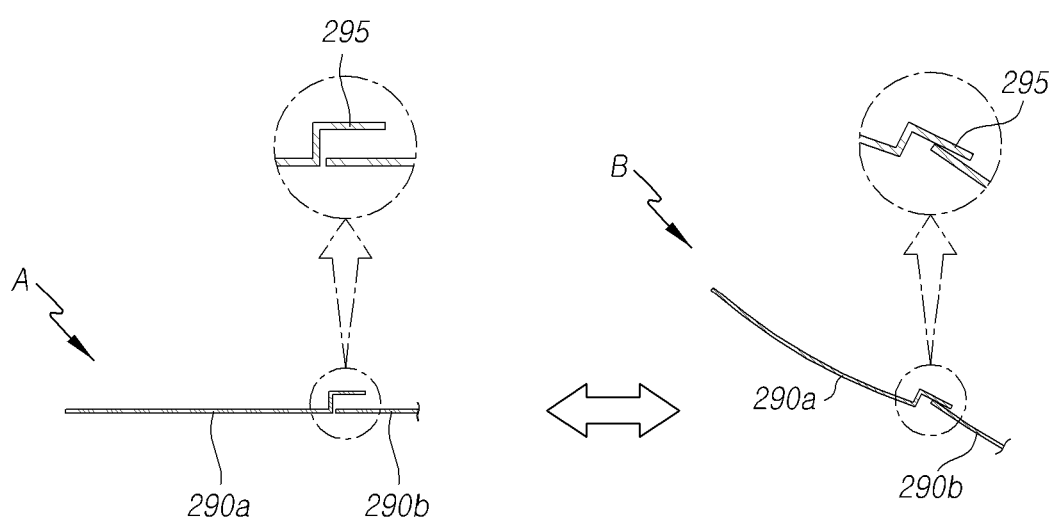
FIG. 13 is a sectional view illustrating an inner plate illustrated in FIG. 10.
Figure 14:
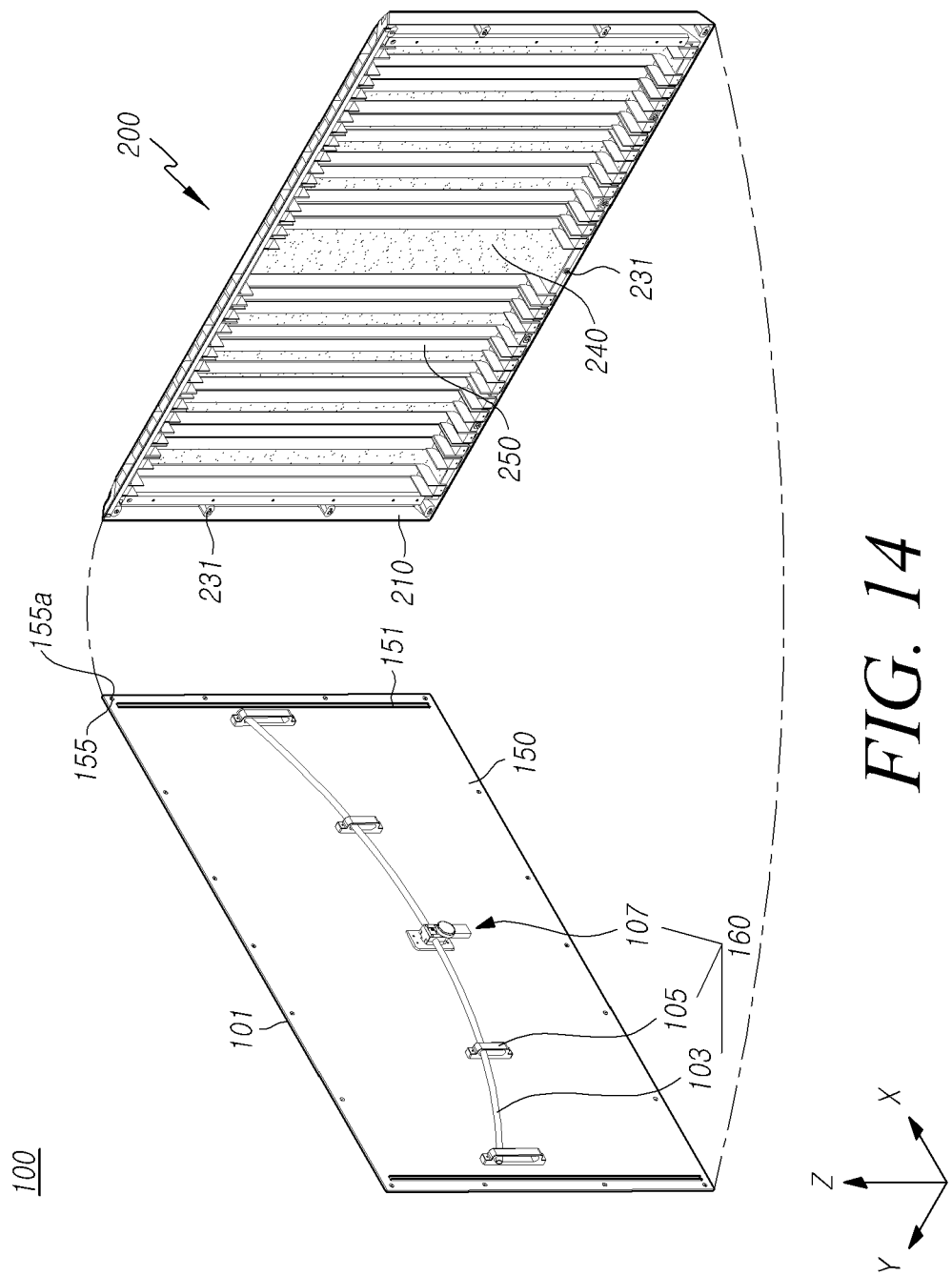
FIG. 14 is a perspective view illustrating a flexible display device according to embodiments of the present disclosure.
Figure 15:
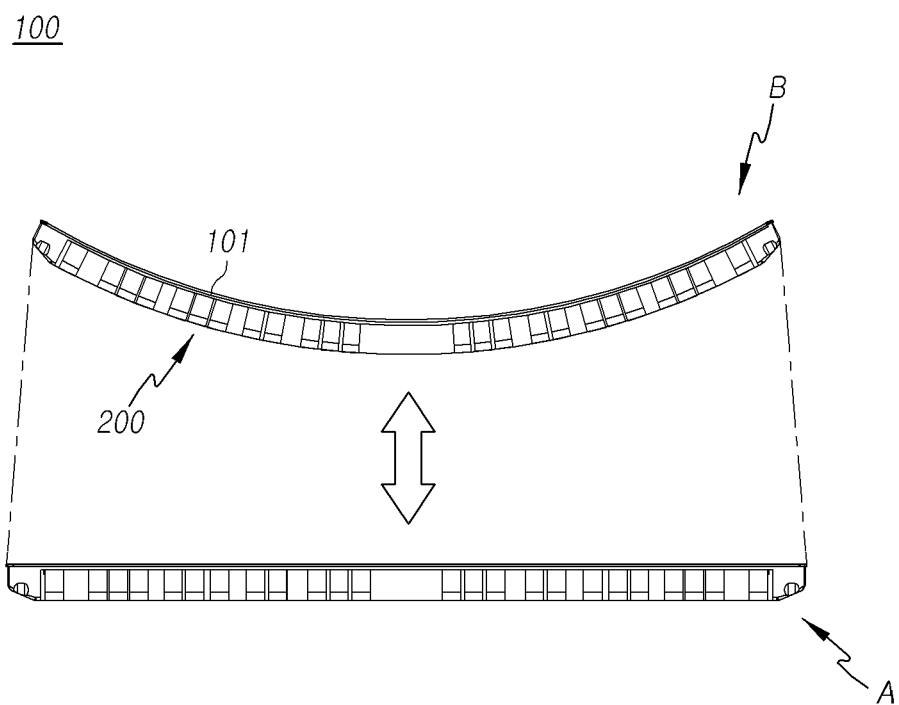
FIG. 15 is a plan view illustrating the flexible display device in a bent state according to embodiments of the present disclosure.
Figure 16:
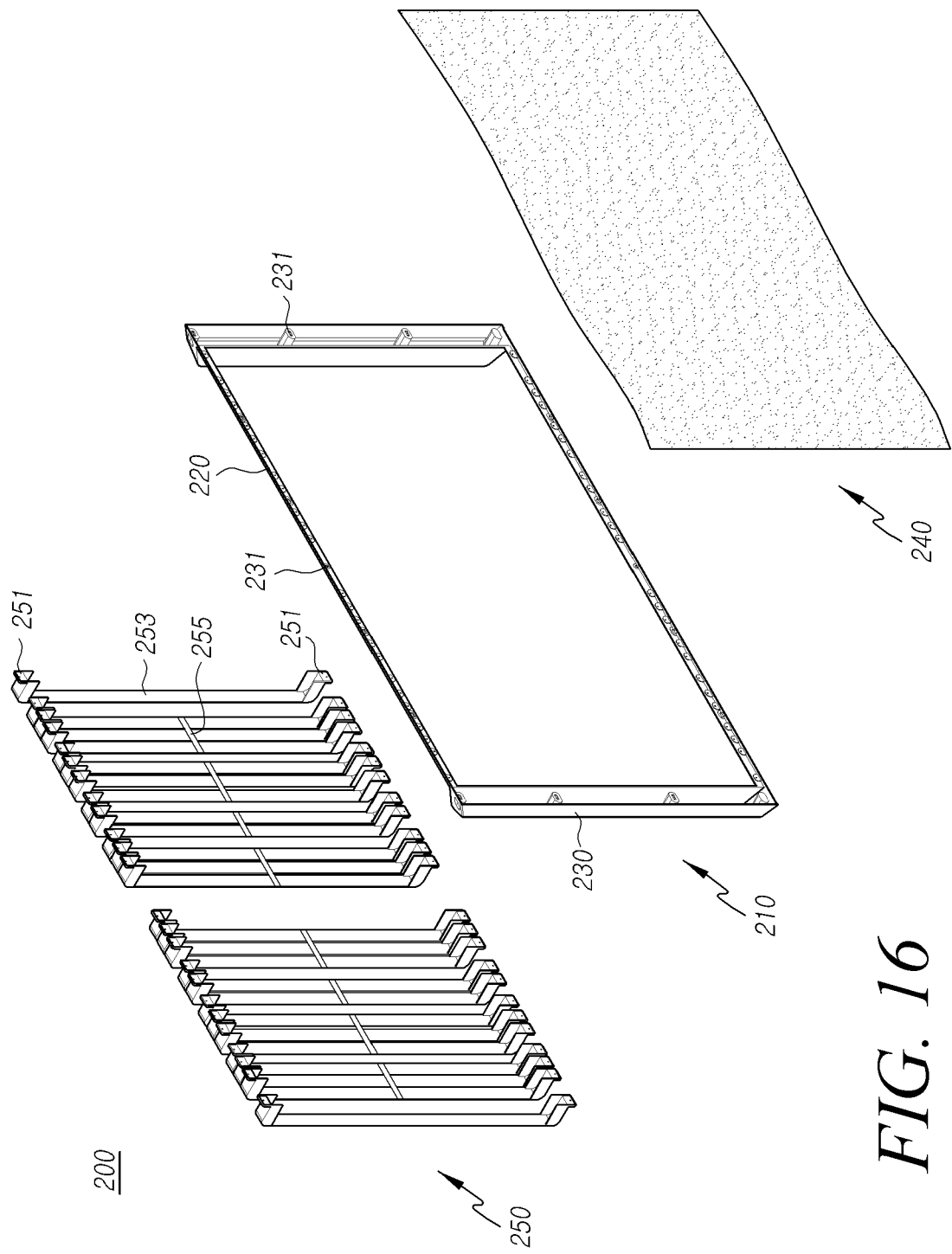
FIGS. 16 and 17 are perspective views illustrating parts of the flexible display device according to embodiments of the present disclosure.
Figure 17:
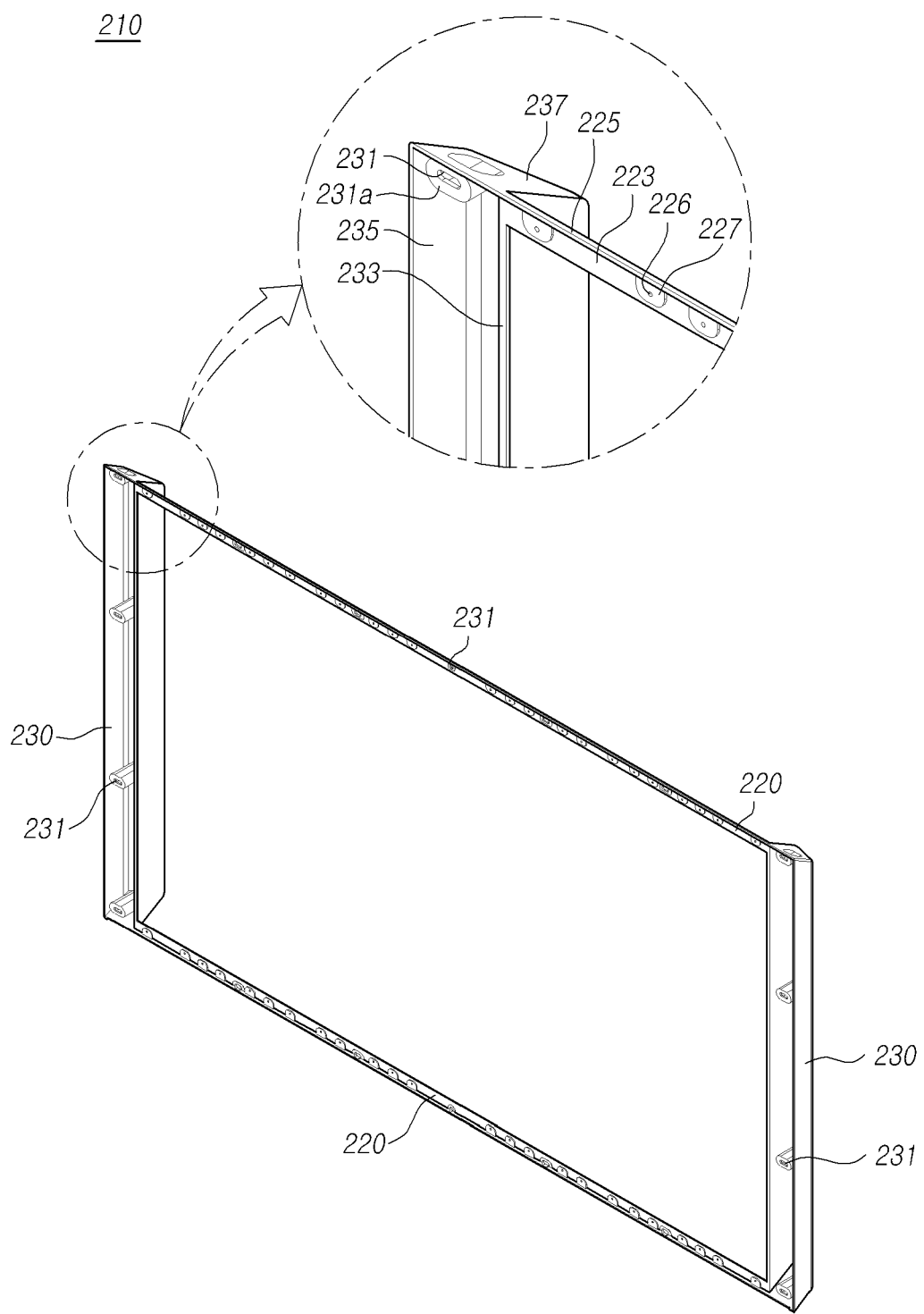
Figure 18:
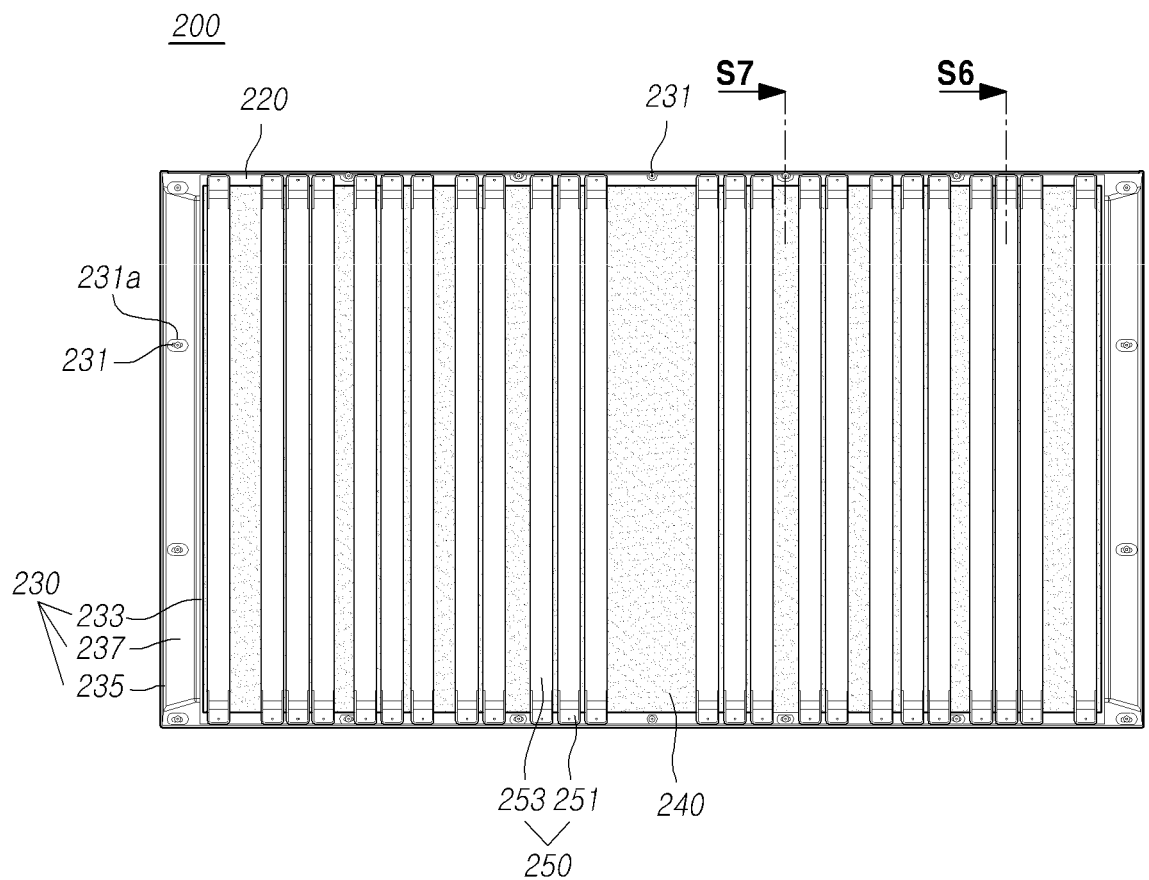
FIG. 18 is a front view illustrating a part of the flexible display device according to embodiments of the present disclosure.
Figure 19:
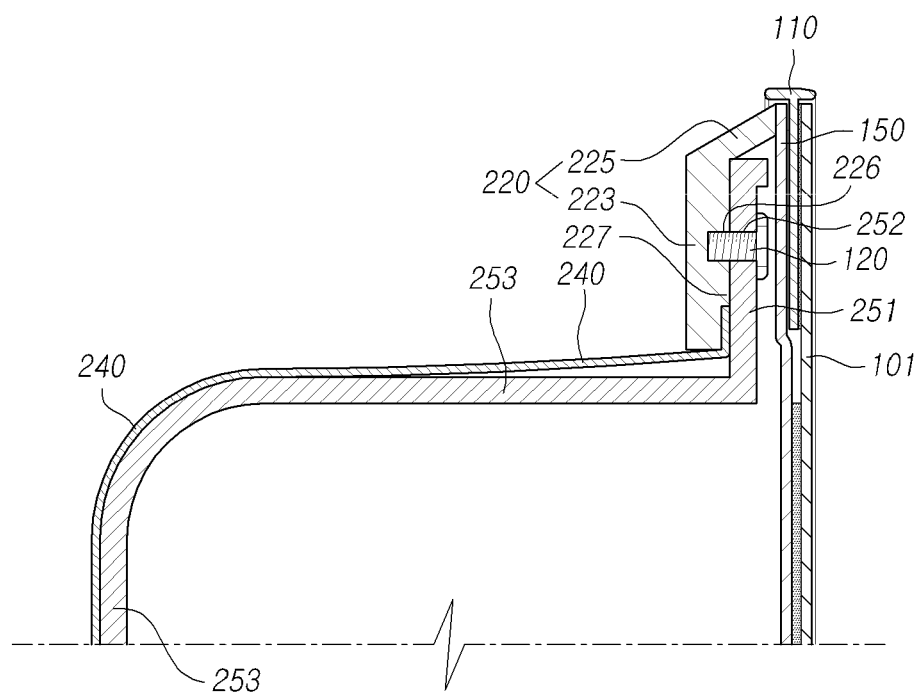
FIG. 19 is a sectional view illustrating a part S6 illustrated in FIG. 18.
Figure 20:
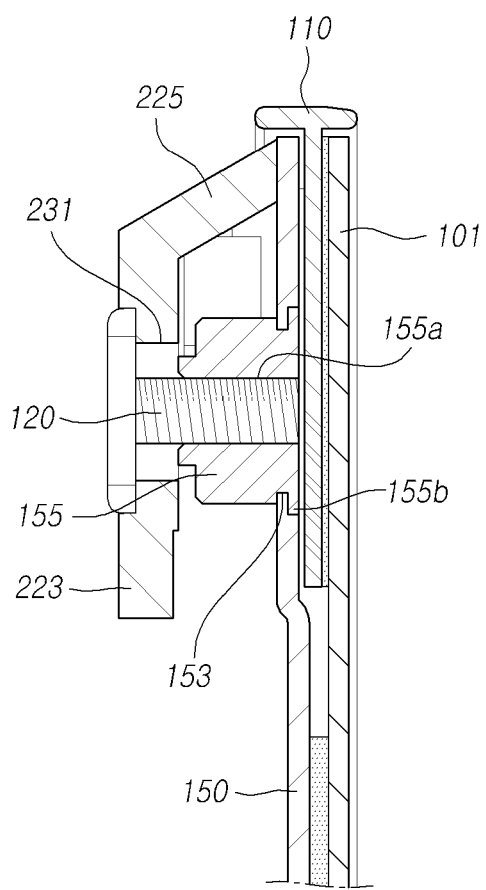
FIG. 20 is a sectional view illustrating a part S7 illustrated in FIG. 18.

FIG. 1 is a perspective view illustrating a flexible display device according to embodiments of the present disclosure. FIGS. 2 to 5 are perspective views illustrating parts of the flexible display device according to embodiments of the present disclosure. FIG. 6 is a sectional view illustrating a part 51 illustrated in FIG. 2. FIG. 7 is a sectional view illustrating a part S2 illustrated in FIG. 2. FIG. 8 is a sectional view illustrating a part S3 illustrated in FIG. 2. FIGS. 9 and 10 are perspective views illustrating parts of the flexible display device according to embodiments of the present disclosure. FIG. 11 is a sectional view illustrating a part S4 illustrated in FIG. 10. FIG. 12 is a sectional view illustrating a part S5 illustrated in FIG. 10. FIG. 13 is a sectional view illustrating an inner plate illustrated in FIG. 10. FIG. 14 is a perspective view illustrating a flexible display device according to embodiments of the present disclosure. FIG. 15 is a plan view illustrating the flexible display device in a bent state according to embodiments of the present disclosure. FIGS. 16 and 17 are perspective views illustrating parts of the flexible display device according to embodiments of the present disclosure. FIG. 18 is a front view illustrating a part of the flexible display device according to embodiments of the present disclosure. FIG. 19 is a sectional view illustrating a part S6 illustrated in FIG. 18. FIG. 20 is a sectional view illustrating a part S7 illustrated in FIG. 18.

Referring to FIGS. 1 to 13, a flexible display device 100 according to embodiments of the present disclosure may include a back cover 150 engaged with a display panel 101 on a front surface thereof and including coupling members 155 arranged apart from each other along the periphery of a rear surface thereof, each coupling member 155 having a through hole 155a with a screw portion formed therein, a curvature changing member 160 provided on the rear surface of the back cover 150 and changing the curvature of the back cover 150, and a rear cover 200 which includes an outer frame 260 including fastening holes 231 at positions corresponding to the through holes 155a of the coupling members 155, disposed along the periphery of the rear surface of the back cover 150, and engaged with the rear surface of the back cover 150 by means of fixing members 120, and openings 273a opened vertically and arranged side by side, apart from each other on upper and lower ends of the outer frame 260, and which is bent along with the back cover 150, supporting the rear surface of the back cover 150, when the curvature changing member 160 operates.

According to embodiments of the present disclosure, one or more support members 103 having a slow curvature may be provided to be rotatably engaged with the rear surface of the back cover 150. A single support member 103 is shown in FIG. 1, by way of example.

A driver 107 rotating the support member 103 may include a motor and a decelerator. Guide members 105 into which the support member 103 is supportedly inserted may be engaged with the back cover 150 or with reinforcement brackets installed to the back cover 150. In FIG. 1, the guide members 105 are shown as engaged with the back cover 150, by way of example.

The curvature changing member 160 may bend the display panel 101 and the back cover 150 by rotating the support member 103 with an operational force of the driver 107 including the motor and the decelerator. The decelerator may include a plurality of gears engaged and rotated with the motor and the support member 103.

For example, when the decelerator includes a worm and a worm wheel, rotation of the worm wheel by the worm engaged with a motor shaft leads to rotation of the support member 103 engaged with the worm wheel, thereby bending the display panel 101 and the back cover 150 according to the curvature of the support member 103. Various gears are available as the plurality of gears in the decelerator in embodiments of the present disclosure, and thus will not be described in detail herein.

Further, as illustrated in FIG. 1, vertically elongated cover reinforcement members 151 may be provided at positions close to the left and right ends of the rear surface of the back cover 150.

The cover reinforcement members 151 are used to reinforce the vertical strength of the back cover 150. Since the cover reinforcement members 151 are extended in the vertical direction of the back cover 150 to prevent upper and lower ends of the back cover 150 from being deformed forward, that is, to prevent the back cover 150 from bending in a rotating direction with respect to the X axis in the coordinate system illustrated in FIG. 1, when the back cover 150 is bent, the cover reinforcement members 151 may maintain a curvature in a user-intended constant bending direction with a user-intended constant bending force.

Further, the display panel 101 is supportedly engaged with the front of the back cover 150. According to embodiments of the present disclosure, the display panel 101 may be either an LCD panel or a light emitting display panel.

That is, when the display panel 101 is an LCD panel, the display panel 101 may further include a backlight unit irradiating light onto the LCD panel, a lower polarization plate attached to a lower substrate, and an upper polarization plate attached to the front surface of an upper substrate. The specific configurations of the lower substrate and the upper substrate may vary according to driving modes of the LCD panel, for example, twisted nematic (TN) mode, vertical alignment (VA) mode, in plane switching (IPS) mode, and fringe field switching (FFS) mode.

Further, when the display panel 101 is a light emitting display panel, the light emitting display panel may include a lower substrate with a plurality of light emitting cells formed in each if areas defined by gate lines, data lines, and power (VDD) lines, and an upper substrate bonded to the lower substrate face to face. Drawings and a detailed description of the light emitting display panel are not provided herein.

As described above, the display panel 101 is not limited to any particular type in embodiments of the present disclosure. For example, the display panel 101 may be made up of a flexible substrate to be bendable in embodiments of the present disclosure. The following description is given irrespective of display panel types.

In embodiments of the present disclosure, as the curvature of the display panel 101 is changed by rotating the support member 103 through operation of the driver 107 with which a substantial center of the support member 103 is rotatably engaged, the display panel 101 may be set to a flat mode in which the front surface of the display panel 101 is flat or a curved mode in which the front surface of the display panel 101 is concave. Even in the curved mode, various curvature radiuses may be set for the display panel 101 according to rotation amounts of the support member 103.

The support member 103 may be formed of a metallic material of a high strength such as an aluminum alloy or stainless steel, to bend the display panel 101 and the back cover 150. The support member 103 may be formed to have a specific curvature at which a user may conveniently view the display panel 101.

In embodiments of the present disclosure, for example, the support member 103 is mounted to the rear surface of the back cover 150, bent with a curvature radius R of about 5000 to 1000 mm. In embodiments of the present disclosure, the support member 103 rotates with respect to the X axis and bends both side ends of the back cover 150 in a rotating direction with respect to the Z axis in FIG. 1.

When the display panel 101 is in the flat mode, the support member 103 rotates with respect to the X axis so that a plan (XZ plane) defined by the support member 103 and the curvature center point of the support member 103 is parallel to the back cover 150. When the display panel 101 is in the curved mode, the support member 103 rotates with respect to the X axis so that a plan (XY plane) defined by the support member 103 and the curvature center point of the support member 103 is perpendicular to the back cover 150. Thus, the display panel 101 may be placed in the curved mode by elastic deformation of the back cover 150.

Further, the guide members 105 may be engaged with the rear surface of the back cover 150 to support rotation of the support member 103, when the support member 103 rotates. Each of the guide members 105 may be provided with a guide hole into which the support member 103 is supportedly inserted.

As illustrated in FIG. 1, one or more guide members 105 may be disposed on each of both sides of the back cover 150 with respect to the driver 107 at the center, thereby further facilitating rotation of the support member 103.

The support member 103 may be formed in the shape of a hollow bent pipe or a solid bent bar.

Since the coupling members 155 are arranged apart from each other along the periphery of the rear surface of the back cover 150 engaged with the display panel 101 on the front surface thereof, the back cover 150 may be fixed to the rear cover 200 by means of the coupling members 155.

As illustrated in FIGS. 6, 7 and 8, a middle cabinet 110 may supportingly be engaged with the front surface of the back cover 150 and the rear surface of the display panel 101, along the periphery of the back cover 150.

The rear cover 200 is provided with the fastening holes 231 at the positions corresponding to the coupling members 155 of the back cover 150 and thus engaged with the rear surface of the back cover 150 by the fastening holes 231. When the curvature changing member 160 operates, the rear cover 200 is bent along with the back cover 150, supporting the rear surface of the back cover 150.

The through holes 155a are formed at the centers of the coupling members 155 engaged with the back cover 150, and engagement holes 153 are formed apart from each other along the periphery of the back cover 150. Therefore, the coupling members 155 are fixed in the engagement holes 153 of the back cover 150.

Further, an insertion end portion 155b is formed at one end of each coupling member 155 to be fixedly inserted into an engagement hole 153 of the back cover 150. The insertion end portions 155b of the coupling members 155 are fixed in the engagement holes 153 by forced insertion, welding, fusion, or the like.

Further, screw threads may be formed on the inner circumferential surfaces of the through holes 155a of the coupling members 155, so that when the coupling members 155 are engaged with the fastening holes 231 of the rear cover 200, the coupling members 155 and the fastening holes 231 may be screw-engaged with each other by the fixing members 120.

The rear cover 200 includes the outer frame 260 which is disposed along the periphery of the rear surface of the back cover 150 and includes the fastening holes 231 at the positions corresponding to the through holes 155a of the coupling members 155, and the openings 273a opened vertically and arranged side by side apart from each other on the upper and lower ends of the outer frame 260.

The rear cover 200 may further include an inner plate 290 which is engaged with the outer frame 260, filling inside the periphery of the outer frame 260, and disposed on the rear surface of the back cover 150. The outer frame 260 may be formed of plastic resin, and the inner plate 290 may be formed of a highly elastic thin metal.

The outer frame 260 includes horizontal frames 270 supporting the upper and lower ends of the back cover 150, respectively, and vertical frames 280 connecting the left ends and right ends of the horizontal frame 170, respectively and supporting the left and right ends of the back cover 150, respectively.

On each of the horizontal frames 270, fastening supports 273 each protruding backward from an outer end portion 271 supported by the rear surface of the back cover 150 and including a fastening hole 231 are arranged side by side, apart from each other, and each opening 273a which is vertically opened is provided between side walls of fastening supports 273 and an outer end portion 271.

Therefore, when the horizontal frames 270 are bent along with bending of the back cover 150, the horizontal frames 270 are bent more easily than a structure without the openings 273a and kept in the bent state without deformation of or damage to the outer frame 260 after the bending, due to the outer end portions 271 around the openings 273a having relatively low rigidity.

Figure 3:
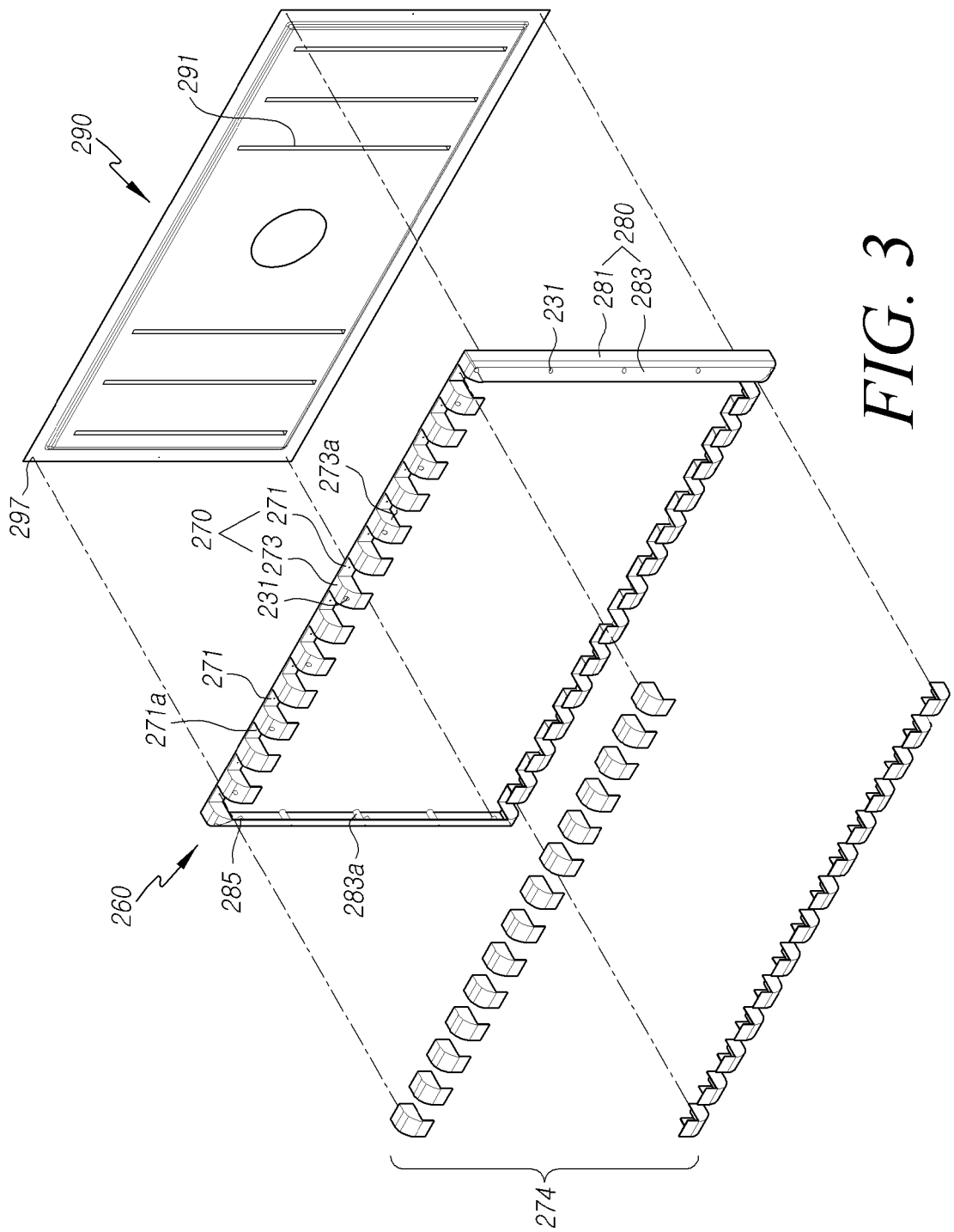
Figure 4:
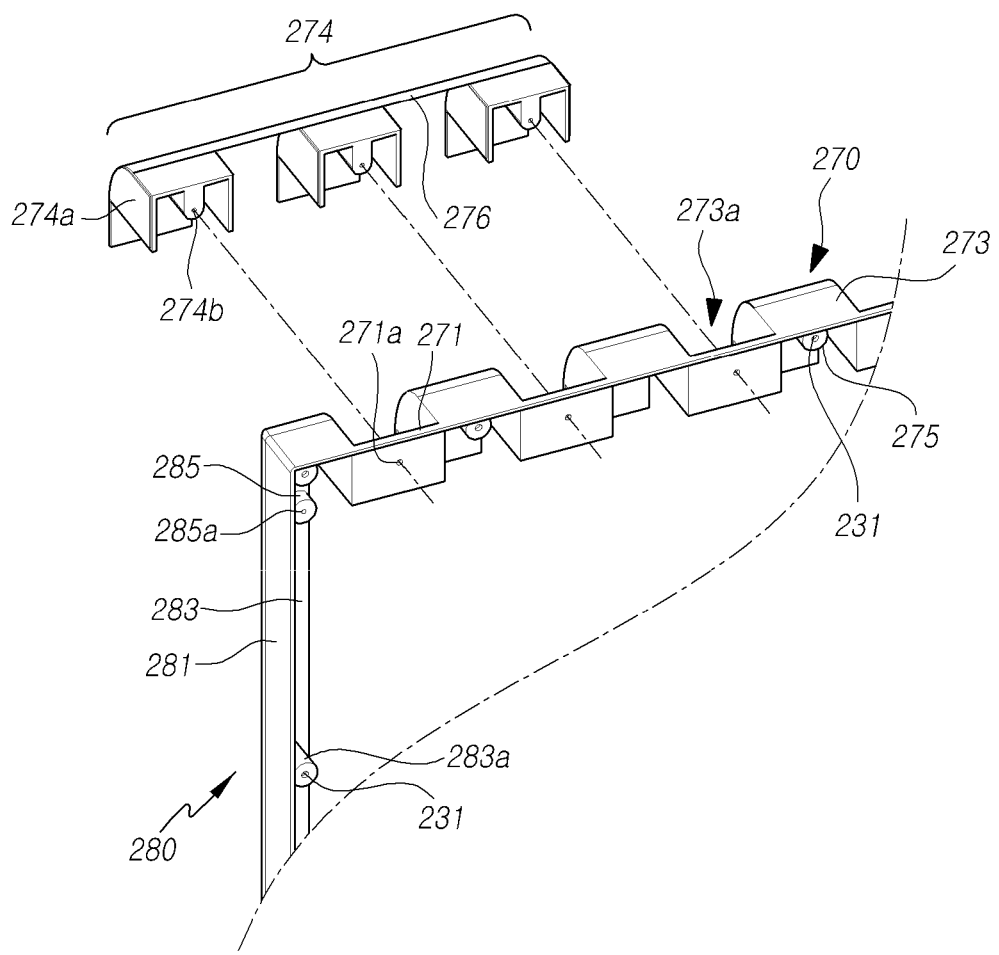
Figure 5:
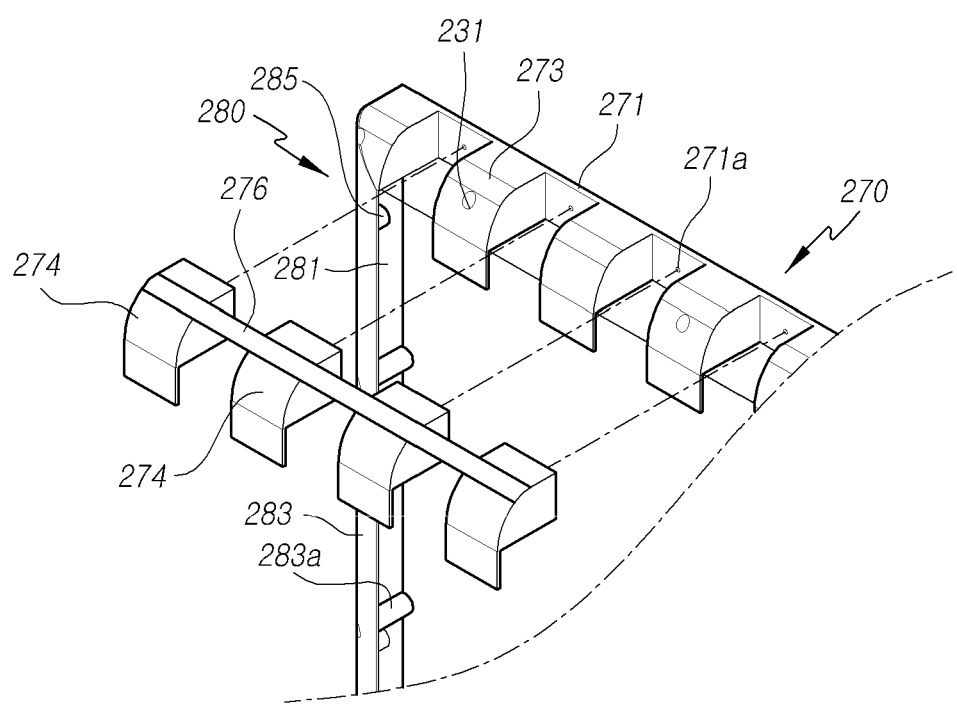

As illustrated in FIGS. 3, 4 and 5, an insertion member 274 may be provided in each opening 273a between side walls of fastening supports 273 and an outer end portion 271. The insertion member 274 may be provided, on at least one of both side surfaces thereof, with a clearance compensation member 274a formed of an elastic material and supported by a sidewall of a fastening support 273, as illustrated in FIG. 4. Two or more insertion members 274 may be coupled to each other by a connection member 276, as illustrated in FIGS. 4 and 5.

When the back cover 150 is in the flat mode, the clearance compensation members 274a illustrated in FIG. 4 are engaged in an elastically compressed state with the horizontal frames 270 which are bent along with bending of the back cover 150, so that each clearance compensation member 274a compensates clearances between fastening supports 273 and the insertion member 274 in both directions.

Therefore, when the horizontal frames 270 are bent, the clearance compensation members 274a are elastically restored, thereby compensating for the clearances between the fastening supports 273 and the insertion members 374.

Further, as illustrated in FIG. 6, a fixing hole 271a is provided on each outer end portion 271 in the horizontal frames 270, and an opposing hole 274b is provided on an insertion member 274 at a position opposing the fixing hole 271a of the outer end portion 271. The outer end portion 271 is engaged with the insertion member 274 by means of a fixing member 120 penetrating into the fixing hole 271a and the opposing hole 274b.

As the insertion members 274 are fixed to the upper and lower horizontal frames 270, the back cover 150 may be bent together with the horizontal frames 270 and maintain a curvature with a constant bending force.

Further, a plurality of slits 291 may be formed to be elongated vertically on the inner plate 290. The slits 291 may be cut-out holes or grooves, and arranged in the same number and size at symmetrical positions on both left and right sides of the inner plate 290 with respect to the center of the inner plate 290.

Therefore, when the inner plate 290 is bent together with the back cover 150, the bending force of the inner plate 290 may be reduced, so that the bending may be made with less force and the curvature of the inner plate 290 may be maintained accurately.

As illustrated in FIG. 7, a fixing boss 285 is provided inside each connection support 283, protruding toward the back cover 150 and supported by the inner plate 290. Since a fixing hole 285a is formed in the fixing boss 285, the fixing boss 285 is engaged with the inner plate 290 by inserting a fixing member 120 into the fixing hole 285a and a plate hole 297 of the inner plate 290. In some embodiments, the fixing member 120, as well as other fixing members described herein, may be any type of fastener, such as a screw, bolt, or other like fastener.

That is, the inner plate 290 is engaged with the connection supports 283 of the vertical frames 280, only at left and right ends thereof, not at the upper and lower ends thereof.

Therefore, as the left and the right ends of the inner plate 290 are fixed to the connection supports 283, the back cover 150 may be bent together with the vertical frames 280 and maintain a curvature with a constant bending force.

Fastening bosses 283a are provided at inner edges of the connection supports 283, protruding toward the back cover 150. As fastening holes 231 are provided on the fastening bosses 283a, the fastening bosses 283a are engaged with coupling members 155 by means of fixing members 120. Thus, when the back cover 150 is bent, the connection supports 283 support the left and right ends of the back cover 150.

As illustrated in FIG. 8, each fastening support 273 is provided therein with a fastening boss 275 protruding toward the back cover 150, and a fastening hole 231 is provided in the fastening boss 275. Therefore, the coupling members 155 of the back cover 150 are coupled with the fastening bosses 275 by fixing members 120, and the fastening supports 273 support the upper and lower ends of the back cover 150, when the back cover 150 is bent.

Each of the vertical frames 280 includes the connection support 283 connecting upper and lower outermost fastening supports 273 on one of both sides of the horizontal frames 270, and an outer support 281 bent forward from a side of the connection support 283 and supporting one of the left and right ends of the back cover 150.

Further, as illustrated in FIGS. 9 and 10, there may be a plurality of inner plates 290 in the left and right directions. In this case, a plurality of inner plates 290a, 290b, 290c, and 290-1 are provided with fixing flanges 293 at the top and bottom thereof, as illustrated in FIG. 9, and engaged with fixing ends 277 provided at the inner bottoms of the fastening supports 273 by fixing members 120, as illustrated in FIG. 11.

These inner plates 290 are fixed to the horizontal frames 270 only at upper and lower ends thereof, and are arranged in the same number and size at symmetrical positions on the left and right sides with respect to the center 290-1. Therefore, when the back cover 150 and the inner plates 290 are bent, the same bending force is maintained on both sides of the center 290-1 without concentrating on any one of the left and right sides, so that the inner plates 290 are not distorted and maintains a constant curvature.

In FIGS. 9 and 10, the inner plates 290c immediately adjacent to the center 290-1 on both sides are of the same size, the inner plates 290b next to the inner plates 290c on both sides of the center 290-1 are of the same size, and the outermost inner plates 290a are of the same size, by way of example. The widths of the inner plates 290a, 290b, and 290c decrease from the center 290-1 toward both sides.

Further, each of the inner plates 290a, 290b, 290c, and 290-1 is provided, on at least one of both side ends thereof, with a stepped flange 295 protruding forward, as illustrated in FIG. 13. When the inner plates 290 are bent together with the back cover 150, the side ends of adjacent inner plates 290 are supported by stepped flanges 295.

That is, when the inner plates 290 are bent along with the back cover 150, both ends of each inner plate 290 are supported by the stepped flanges 295 of adjacent inner plates 290. Thus, even though the gap between adjacent inner plates 290 is opened, the inside is not exposed.

That is, as illustrated in FIG. 13, in flat mode A, the outermost inner plates 290a and their adjacent inner plates 290b are disposed on the same plane. However, when the flat mode A is transitioned to curved mode B and thus the inner plates 290 are bent, the ends of the adjacent inner plates 290b are supported by the stepped flanges 295 of the outermost inner plates 290a. Therefore, even though the gap between adjacent inner plates is widened, the inside is not exposed.

Referring to FIGS. 14 to 20, the flexible display device 100 according to embodiments of the present disclosure includes the back cover 150 engaged with the display panel 101 on the front surface thereof and including the coupling members 155 arranged apart from each other along the periphery of the rear surface thereof, each coupling member 155 having a through hole 155a with a screw portion formed therein, the curvature changing member 160 provided on the rear surface of the back cover 150 and changing the curvature of the back cover 150, and the rear cover 200 which includes an outer frame 210 including the fastening holes 231 at positions corresponding to the through holes 155a of the coupling members 155, disposed along the periphery of the rear surface of the back cover 150, and engaged with the rear surface of the back cover 150 by means of the fixing members 120, and an outer cover 240 fixed to the outer frame 210 at ends thereof, and which is bent along with the back cover 150, supporting the rear surface of the back cover 150, when the curvature changing member 160 operates.

As the curvature of the display panel 101 is changed by rotating the support member 103 through operation of the driver 107 with which a substantial center of the support member 103 is rotatably engaged, the display panel 101 may be set to the flat mode A in which the front surface of the display panel 101 is flat or the curved mode B in which the front surface of the display panel 101 is concave, as illustrated in FIG. 15.

When the display panel 101 is in the curved mode B, the support member 103 rotates with respect to the X axis so that the plan (XY plane) defined by the support member 103 and the curvature center point of the support member 103 is perpendicular to the back cover 150. When the display panel 101 is in the flat mode A, the support member 103 rotates with respect to the X axis so that the plan (XZ plane) defined by the support member 103 and the curvature center point of the support member 103 is parallel to the back cover 150. Thus, the display panel 101 may be placed in the curved mode B by elastic deformation of the back cover 150.

Since the coupling members 155 are arranged apart from each other along the periphery of the rear surface of the back cover 150 engaged with the display panel 101 on the front surface thereof, the back cover 150 may be fixed to the rear cover 200 by means of the coupling members 155.

The middle cabinet 110 may supportingly be engaged with the front surface of the back cover 150 and the rear surface of the display panel 101, along the periphery of the back cover 150.

The rear cover 200 is provided with the fastening holes 231 at the positions corresponding to the coupling members 155 of the back cover 150 and thus engaged with the rear surface of the back cover 150 by the fastening holes 231. When the curvature changing member 160 operates, the rear cover 200 is bent along with the back cover 150, supporting the rear surface of the back cover 150.

The through holes 155a are formed at the centers of the coupling members 155 engaged with the back cover 150, and engagement holes 153 are formed apart from each other along the periphery of the back cover 150. Therefore, the coupling members 155 are fixed in the engagement holes 153 of the back cover 150.

Further, an insertion end portion 155b is formed at one end of each coupling member 155 to be fixedly inserted into an engagement hole 153 of the back cover 150. The insertion end portions 155b of the coupling members 155 are fixed in the engagement holes 153 by forced insertion, welding, fusion, or the like.

Further, screw threads may be formed on the inner circumferential surfaces of the through holes 155a of the coupling members 155, so that when the coupling members 155 are engaged with the fastening holes 231 of the rear cover 200, the coupling members 155 and the fastening holes 231 may be screw-engaged with each other by the fixing members 120.

The rear cover 200 includes the outer frame 210 which is disposed along the periphery of the rear surface of the back cover 150 and includes the fastening holes 231, and the outer cover 240 fixed to the outer frame 210 at ends thereof and disposed inside the periphery of the outer frame 210.

The rear cover 200 may further include inner frames 250 which are engaged with the outer frame 210 by connecting the upper and lower ends of the outer frame 210. The outer frame 210 and the inner frames 250 may be formed of plastic resin.

The outer frame 210 is empty inside the square-shaped periphery thereof. As the outer frame 210 is engaged with the periphery of the rear surface of the back cover 150, when the back cover 150 is bent, the outer frame 210 is bent along with the back cover 150, supporting the back cover 150, and the inner frames 250 are engaged in the empty space inside the outer frame 210.

A plurality of inner frames 250 are arranged side by side apart from each other, connecting the upper and lower ends of the outer frame 210. The inner frames 250 may be arranged in the same number at positions symmetrical on left and right sides with respect to the center of the back cover 150.

Therefore, when the rear cover 200 is bent along with the back cover 150, the same bending force is maintained on both sides of the center without concentrating on any one of the left and right sides, so that the rear cover 200 is not distorted and maintains a constant curvature.

As illustrated in FIG. 16, the inner frames 250 may be engaged with the outer frame 210, with each connection member 255 connecting two or more inner frames 250 to each other. As the inner frames 250 connected by twos or more are engaged with the outer frame 210, assembly becomes simple and assembly processes may be reduced. In an embodiment of the present disclosure, the inner frames 250 are shown as connected to each other by twos or threes using the connection members 255, by way of example.

The outer cover 240 fixed to the outer frame 210 at the peripheral ends thereof and surrounding the outer surfaces of the inner frames 250 may be formed of fabric. The fabric of which the outer cover 240 is formed includes highly elastic synthetic fabric such as polyurethane fabric, polyester fabric, or rubber fabric. This highly elastic synthetic fabric or fabric obtained by weaving highly elastic synthetic fiber with any other synthetic fiber forms the outer cover 240.

Because this outer cover 240 is highly elastic, the outer cover 240 is elastically deformed, fixed to the outer frame 210 at the peripheral ends thereof and surrounding the outer surfaces of the inner frames 250. Therefore, the outer cover 240 is elastically deformed, tightly to the outside and maintains a flat appearance, while its inside is not visible from the outside.

Further, each of the inner frames 250 includes end coupling portions 251 which are provided at upper and lower ends thereof and coupled to the outer frame 210, and rear connection portions 253 bent backward from the upper and lower end coupling portions 251 and connecting the upper and lower end coupling portions 251 to each other.

The upper and lower end coupling portions 251 are formed in parallel to the back cover 150 and coupled with the outer frame 210. The upper and lower end coupling portions 251 are bent backward and connected to each other, thereby forming the rear connection portions 253.

Since these inner frames 250 are engaged with the outer cover 240, supporting vertically the outer frame 210, when the back cover 150 and the outer frame 210 are bent with their both side ends directed forward, the inner frames 250 enable a curvature to be maintained with a constant bending force, and prevent the upper and lower ends of the outer frame 210 from being directed forward and distorted.

The outer frame 210 includes horizontal frames 220 supporting the upper and lower ends of the back cover 150, respectively, and vertical frames 230 connecting the left ends and right ends of the horizontal frames 220 and supporting the left and right ends of the back cover 150, respectively.

The outer frame 210 with the upper and lower horizontal frames 220 connected to the left and right vertical frames 230 is engaged with the periphery of the rear surface of the back cover 150. Because the horizontal frames 220 are shaped into bars with smaller cross-sectional areas than those of the vertical frames 230, when the back cover 150 is bent, the outer frame 210 is easily bent.

The horizontal frames 220 include fastening supports 223 arranged in parallel apart from each other behind the back cover 150 and having the fastening holes 231 formed thereon, and cover supports 225 extended from end portions of the fastening supports 223 and supporting the upper and lower ends of the back cover 150.

The fastening supports 223 are formed in parallel to the back cover 150, and the end coupling portions 251 of the inner frames 250 are supportedly engaged with the front surfaces of the fastening supports 223. The cover supports 225 are extended inclinedly toward the back cover 150 from the ends of the fastening supports 223 and thus have end portions formed to support the rear surface of the back cover 150.

Therefore, when both side ends of the horizontal frames 220 are bent forward along with bending of the back cover 150, the horizontal frames 220 may be less distorted than when the horizontal frames 220 are shaped into flat plates, and may maintain a constant curvature.

Each of the vertical frames 230 includes an inner support 233 connecting ends of the upper horizontal frame 220 and the lower horizontal frame 220 on the sample plane, an outer support 235 spaced from the inner support 233 outward in a side direction and supporting the left or right end of the back cover 150, and a connection support 237 connecting the rear end portions of the inner support 233 and the outer support 235 to each other.

The inner supports 233 and the fastening supports 223 form a square periphery on the same plane, so that the peripheral ends of the outer cover 240 may be fixed to the inner supports 233 and the fastening supports 223.

The outer supports 235 are integrally connected to the inner supports 233 by the connection supports 237. Therefore, when the back cover 150 and the vertical frames 230 are bent with the both side ends of the back cover 150 and the vertical frames 230 directed forward, the left and right ends of the back cover 150 are supported with a constant bending force. Accordingly, the back cover 150 is supported without distortion, while maintaining a constant curvature.

Further, each of the connection supports 237 is provided with fastening bosses 231a protruding toward the back cover 150, and each of the fastening bosses 231a includes a fastening hole 231. Thus, the fastening bosses 231a are coupled to the coupling members 155 of the back cover 150 by means of the fixing member 120, and support the left and right ends of the back cover 150, when the back cover 150 is bent.

As illustrated in FIG. 19, a protruding surface 227 having a fastening hole 226 formed thereon is provided on the front surface of each fastening support 223, protruding toward the back cover 150. As the end coupling portions 251 of the inner frames 250 are coupled onto the protruding surfaces 227, the strengths of parts over which the outer frame 210 and the inner frames 250 are coupled to each other are maintained.

The outer cover 240 is coupled to stepped portions under the protruding surfaces 227 of the coupling supports 223 by ultrasonic fusion or thermal fusion, and compressedly supported by the end coupling portions 251.

In the case of ultrasonic fusion, the outer cover 150 may be fused directly to the stepped portions of the fastening supports 223, whereas in the case of thermal fusion, thermoplastic resin is attached to the stepped portions of the fastening supports 223 and then heated, which should not be construed as limiting the present disclosure. Instead, bonding or an adhesive member such as a double-sided tape may be used.

Each of the end coupling portions 251 is provided with a communication hole 252 communicating with a fastening hole 226 of a fastening support 223. Thus, the end coupling portion 251 is engaged with the fastening support 223 by a fixing member 120 penetrating through the fastening hole 226 and the communication hole 252.

As described above, according to embodiments of the present disclosure, a flexible display device may be provided, which allows a user to freely change a curvature to that of a flat display or curved display.

Further, according to embodiments of the present disclosure, a flexible display device may be provided, in which all components of a display device such as a display panel, a back cover, and a rear cover are so configured that the user may achieve an intended curvature from the center to both side ends of the display panel, and thus which may satisfy various demands of the user.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A flexible display device, comprising:
a back cover including a front surface coupled to a display panel and a rear surface;
coupling members arranged on the rear surface of the back cover and spaced apart from each other along a periphery of the rear surface, each coupling member including a through hole having a screw portion;
a curvature changing member disposed on the rear surface of the back cover and configured to change a curvature of the back cover;
a rear cover including an outer frame and openings in upper and lower ends of the outer frame that are spaced apart from each other, wherein during operation of the curvature changing member, the rear cover is bent along with the back cover, while supporting the rear surface of the back cover, the outer frame including fastening holes at positions corresponding to the through holes of the coupling members, the fastening holes being disposed along the periphery of the rear surface of the back cover, and being coupled to the rear surface of the back cover by fixing members; and
an insertion member inserted into the openings with both sides of the insertion member spaced apart and a front surface of the insertion member coupled to a rear surface of the outer frame.

2. The flexible display device according to claim 1, wherein the rear cover further includes an inner plate engaged with the outer frame, the inner plate filling inside a periphery of the outer frame, the inner plate disposed on the rear surface of the back cover.

3. The flexible display device according to claim 2, wherein the outer frame further comprises:
horizontal frames each configured to support an upper end or a lower end of the back cover and including openings; and
vertical frames connected to left ends or right ends of the horizontal frames and configured to support a left end or a right end of the back cover.

4. The flexible display device according to claim 3, wherein the horizontal frames include fastening supports arranged side by side and spaced apart from each other, and protruding backward from outer end portions of the horizontal frames and supported by upper and lower ends of the rear surface of the back cover and including the fastening holes, wherein each of the openings is provided between side walls of the fastening supports and one of the outer end portions.

5. The flexible display device according to claim 4, wherein fastening bosses protrude from inner portions of the fastening supports toward the back cover, and include the fastening holes.

6. The flexible display device according to claim 4, wherein each of the vertical frames further comprises:
a connection support connected to upper and lower outermost fastening supports on one side of the horizontal frames; and
an outer support bent forward from an outer portion of the connection support and configured to support the left end or the right end of the back cover.

7. The flexible display device according to claim 6, wherein the connection support further includes fixing bosses protruding from an inner portion of the connection support toward the back cover and supported by the inner plate, and wherein the fixing bosses include fixing holes to engage the fixing bosses with the inner plate.

8. The flexible display device according to claim 7, wherein the connection support further includes fastening bosses provided on the inner portion of the connection support and protruding toward the back cover, the fastening bosses fastening holes.

9. The flexible display device according to claim 4, wherein the insertion member is spaced apart from side walls of the fastening supports and coupled to one of the outer end portions.

10. The flexible display device according to claim 9, further comprising:
a clearance compensation member provided on at least one side surface of the insertion member, the clearance compensation member formed of an elastic material and supported by a sidewall of a fastening support.

11. The flexible display device according to claim 9, wherein one of the outer end portions includes a fixing hole, the insertion member including an opposing hole formed at a position opposite the fixing hole, and the one of the outer end portions is coupled to the insertion member by a fastener penetrating into the fixing hole and the opposing hole.

12. The flexible display device according to claim 2, wherein the inner plate includes a plurality of slits extending vertically on the inner plate and arranged in the same number and size at symmetrical positions on both left and right sides of the inner plate with respect to a center of the inner plate.

13. The flexible display device according to claim 4, wherein the inner plate is one of a plurality of inner plates, each inner plate including fixing flanges at upper and lower ends thereof and being coupled to fixing ends disposed at inner lower ends of fastening supports.

14. The flexible display device according to claim 13, wherein the plurality of inner plates are arranged in the same number and size at symmetrical positions on left and right sides with respect to a center of the back cover.

15. The flexible display device according to claim 14, wherein each of the plurality of inner plates includes, on at least one of side end thereof, a stepped flange protruding forward, and when the inner plate is bent, an end portion of an adjacent inner plate is supported by the stepped flange.

16. A flexible display device, comprising:
a back cover including a front surface coupled to a display panel and a rear surface;
coupling members arranged on the rear surface of the back cover and spaced apart from each other along a periphery thereof, each coupling member including a through hole having a screw portion;

a curvature changing member disposed on the rear surface of the back cover and configured to change a curvature of the back cover;

a rear cover including an outer frame and an outer cover fixed to the outer frame at ends thereof and disposed in an area inside a periphery of the outer frame, wherein during operation of the curvature changing member, the rear cover is bent along with the back cover, while supporting the rear surface of the back cover, the outer frame including fastening holes at positions corresponding to the through holes of the coupling members, the fastening holes being disposed along the periphery of the rear surface of the back cover, and being engaged with the rear surface of the back cover by fixing members; and an inner frame engaged with the outer frame with upper and lower portions of the outer frame connected to each other, wherein the outer cover comprises a high elastic synthetic fiber material, and wherein peripheral ends of the outer cover are fixed to the outer frame, and an inner region of the peripheral ends of the outer cover surrounds an outer surface of the inner frame and expands elastically, so that an inside of the rear cover is not visible from the outside and prevents foreign substances from entering.

17. The flexible display device according to claim 16, wherein the inner frame is one of a plurality of inner frames arranged in the same number at symmetrical positions on left and right sides with respect to a center of the back cover.

18. The flexible display device according to claim 17, wherein two or more of the inner frames are connected to each other by a connection member.

19. The flexible display device according to claim 16, wherein the inner frame further comprises:

end coupling portions provided at upper and lower ends of the inner frame and coupled to the outer frame; and a rear connection portion bent to protrude backward from the end coupling portions and connected to the end coupling portions.

20. The flexible display device according to claim 19, wherein the outer frame further comprises:

horizontal frames each configured to support an upper end or a lower end of the back cover; and vertical frames each connected to left ends or right ends of the horizontal frames and configured to support a left end or a right end of the back cover.

21. The flexible display device according to claim 20, wherein the horizontal frames further comprise:

fastening supports arranged in parallel and spaced apart from each other on the rear surface of the back cover and including fastening holes; and cover supports extending from end portions of the fastening supports and configured to support the upper and lower ends of the back cover.

22. The flexible display device according to claim 21, wherein each of the vertical frames further comprises:

an inner support connected to ends of the horizontal frames on the same plane with the fastening supports;

an outer support spaced from the inner support outward in a side direction and configured to support the left or right end of the back cover; and a connection support connected to rear end portions of the inner support and the outer support to each other.

23. The flexible display device according to claim 22, wherein the connection support further includes a fastening boss on an inner portion of the connection support and protruding toward the back cover, the fastening boss including a fastening hole.

24. The flexible display device according to claim 21, wherein each of the fastening supports includes a front surface with a protruding surface protruding toward the back cover and including a fastening hole, and an end coupling portion of the inner frame is coupled onto the protruding surface.

25. The flexible display device according to claim 24, wherein the end coupling portion includes a communication hole configured to communicate with the fastening hole of the fastening support.

* * * * *